(12) United States Patent
Olofsson et al.

(10) Patent No.: US 6,879,260 B1
(45) Date of Patent: Apr. 12, 2005

(54) LOAD INDICATOR

(75) Inventors: Lars-Olof Olofsson, Holm (SE);
Martin Ranger, Helsingborg (SE); Per Zellman, Helsingborg (SE)

(73) Assignee: Emotron AB, Helsingborg (SE)

( * ) Notice: Subject to any disclaimer, the term of this patent is extended or adjusted under 35 U.S.C. 154(b) by 0 days.

(21) Appl. No.: 09/559,146

(22) Filed: Apr. 27, 2000

Related U.S. Application Data

(63) Continuation of application No. PCT/SE98/01909, filed on Oct. 22, 1998.

(30) Foreign Application Priority Data

Oct. 28, 1997 (SE) ................................................ 9703952

(51) Int. Cl.$^7$ .............................................. G08B 21/00
(52) U.S. Cl. ........................ 340/648; 340/511; 340/679; 318/430
(58) Field of Search ................................ 340/648, 676, 340/686.3, 607, 608, 611, 679, 511, 636–664; 318/430, 431, 432, 433, 434, 783

(56) References Cited

U.S. PATENT DOCUMENTS

| | | | |
|---|---|---|---|
| 4,195,291 A | * | 3/1980 | Burks, Jr. .................... 340/671 |
| 4,211,967 A | * | 7/1980 | Akiyama et al. ............ 318/490 |
| 4,249,117 A | * | 2/1981 | Leukhardt et al. .......... 318/275 |
| 4,333,118 A | | 6/1982 | Comstedt et al. ............. 361/30 |
| 4,539,562 A | * | 9/1985 | Sanders ....................... 340/657 |
| 4,839,830 A | | 6/1989 | Amey et al. ............ 364/551.01 |
| 5,453,669 A | | 9/1995 | Nishibe et al. .............. 318/434 |
| 5,512,883 A | * | 4/1996 | Lane, Jr. ...................... 340/648 |
| 5,602,708 A | * | 2/1997 | Felgenhauer .................. 361/51 |
| 5,867,357 A | * | 2/1999 | Michel et al. ................. 361/31 |
| 6,078,263 A | * | 6/2000 | Galloway, Jr. ............... 340/679 |

FOREIGN PATENT DOCUMENTS

DE 36 34 731 A1 4/1988

* cited by examiner

Primary Examiner—Thomas J. Mullen, Jr.
Assistant Examiner—Son Tang
(74) Attorney, Agent, or Firm—Browdy and Neimark, P.L.L.C.

(57) ABSTRACT

A load indicator for an electric motor, comprising a first means (II, IU, CPU) for repeated determination of the motor load, a second means (CPU) for comparing the current motor load, as determined by the first means, with a preset load limit, and a third means (CPU), PP) for indicating that the current motor load exceeds the load limit. Moreover, a meant (T, CPU) is arranged to initiate a presetting of the load limit. This means is adapted to be actuated, when the motor runs in normal operation, for presetting of the load limit as the current motor load changed by a predetermined deviation value stored in the load indicator.

11 Claims, 3 Drawing Sheets

LOAD INDICATOR

CROSS REFERENCE TO RELATED APPLICATION

Figure 1:
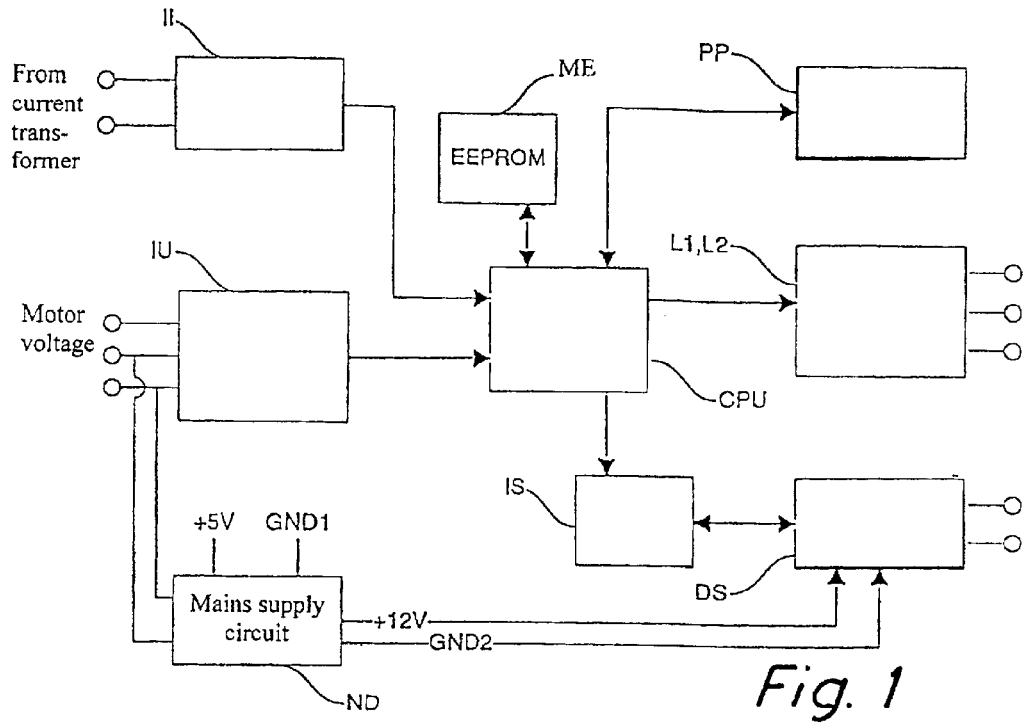

The present application is a continuation of PCT/SE98/01909, filed 22 Oct. 1998, the entire contents of which being hereby incorporated herein by reference.

The present invention relates generally to a load indicator or load monitor for an electric motor, comprising a first means for repeated determination of the motor load, a second means for comparing the current motor load, as determined by the first means, with a preset load limit, and a third means for indicating that the current motor load exceeds the load limit.

Load indicators of this type are well known and enable, for instance, switching-off of the motor in case of overload or underload. U.S. Pat. No. 4,333,118 discloses a load indicator, which determines the motor load as the product of applied voltage and supplied current reduced by a value which is proportional to the absolute value of the supplied current. This difference can, by a suitable proportionality factor, be made to well represent the power emitted by the motor, i.e. the difference between supplied power and lost power in the motor.

In the prior-art load indicators, the presetting of the load limit or limits is relatively time-consuming, and therefore an object of the present invention is to improve the load indicators in this respect.

This object is achieved by the load indicator of the type stated by way of introduction being given the features that appear from appended claim 1. Preferred embodiments of this load indicator are evident from the dependent claims.

According to the invention, the load indicator thus has a means for initiating a presetting of a load limit as the current motor load changed by a predetermined deviation value stored in the load indicator. This initiating means is adapted to be actuated as the motor runs in normal operation.

To achieve the desired setting of the load limit or limits, it is thus only necessary for the motor to be started and made to work in approximately normal conditions in order that an actuation of the initiating means should result in a presetting of the load limit or limits.

The invention is advantageously applicable to such a load indicator as described in the above-mentioned U.S. Pat. No. 4,333,118, but it can also be used in load indicators which repeatedly determines a value, which in some other way represents the motor load, for instance the supplied power, the torque of the motor, the current of the motor or the phase shift between motor voltage and motor current.

The deviation value may consist of one value for a maximum load limit and of another value for a minimum load limit. Each deviation value can be represented or stored in one of many different forms, e.g. as a percentage, which multiplied by the value of the nominal power of the motor yields the actual deviation value. An alternative form of storage can be a percentage, which multiplied by the value of the current load yields the actual deviation value. The deviation value can also be stored as a fixed value.

It is also possible to use, for example, two deviation values which represent deviation in the same direction from the motor load in normal operation. The smaller of these can then be used as an internal alarm or pre-alarm while the greater of the two deviation values is the main alarm and determines when it is time for an external alarm indication or even switching-off of the motor to occur.

Figure 4:
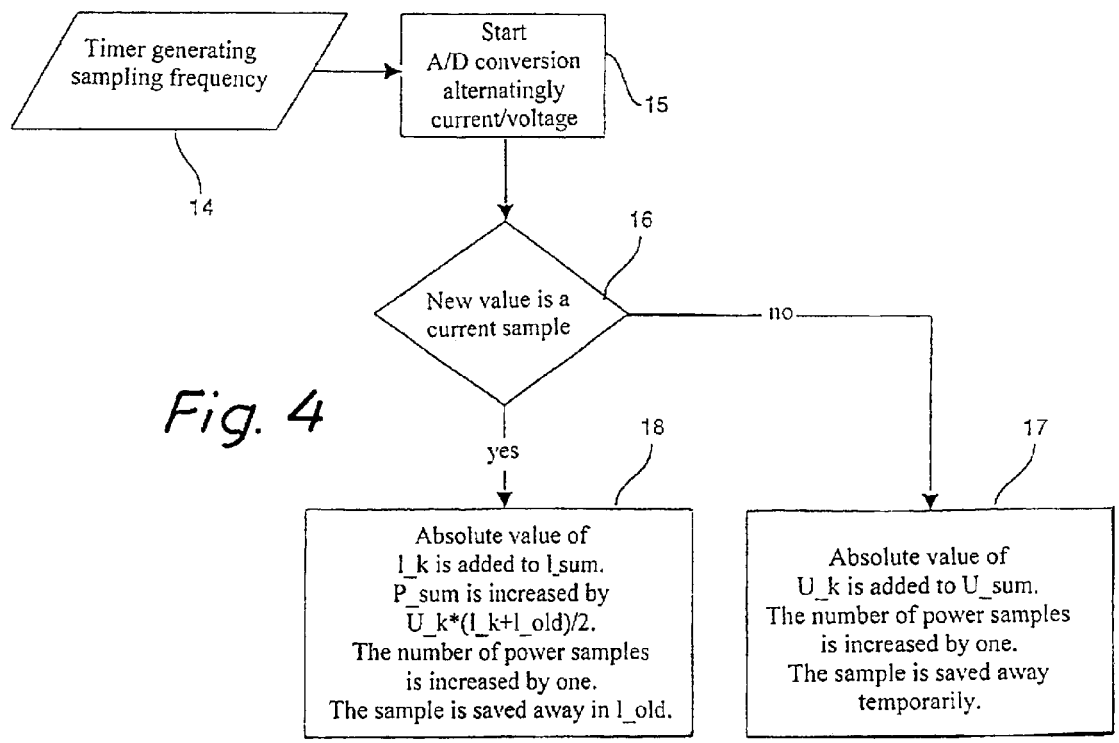
Figure 2:
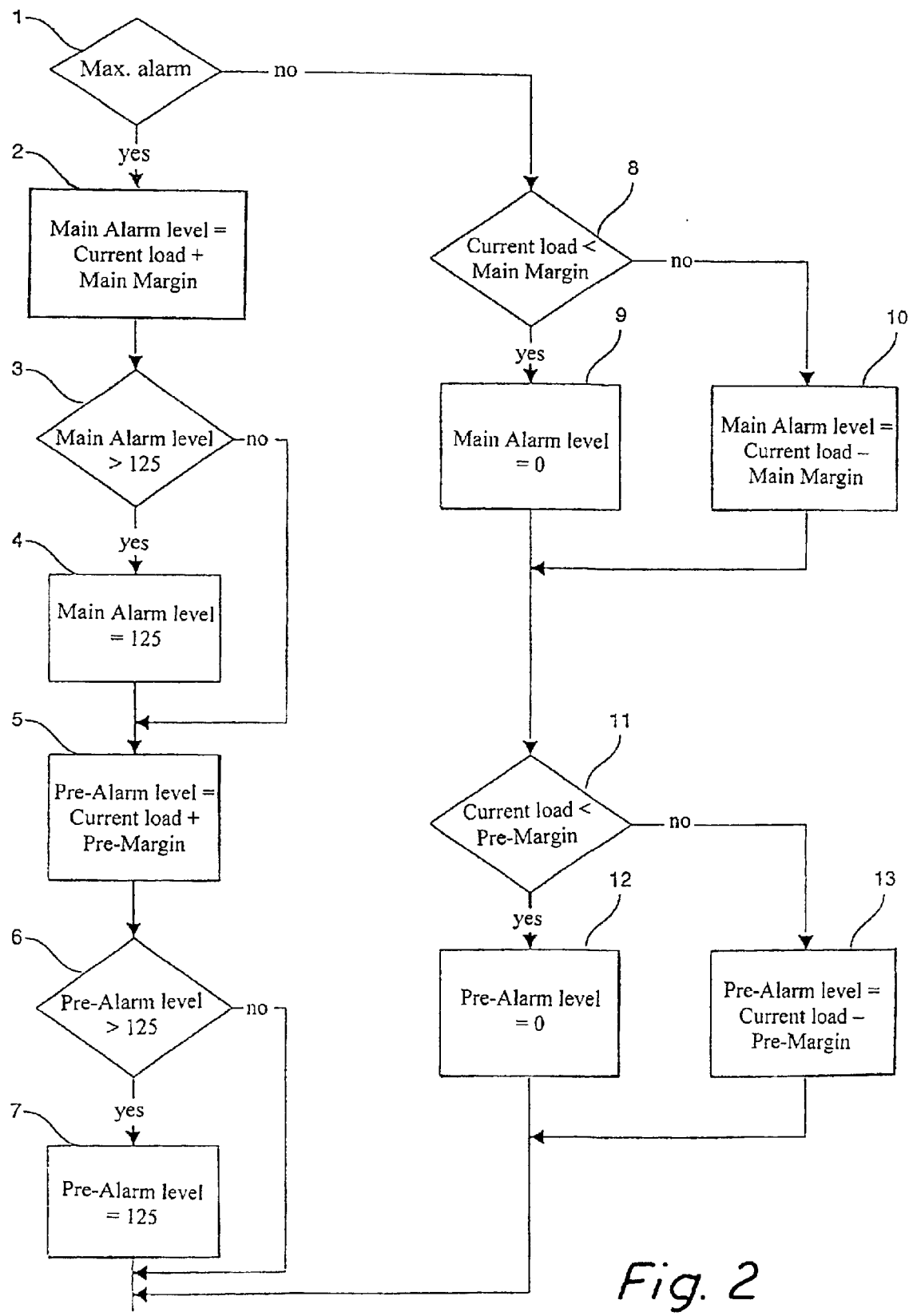
Figure 3:
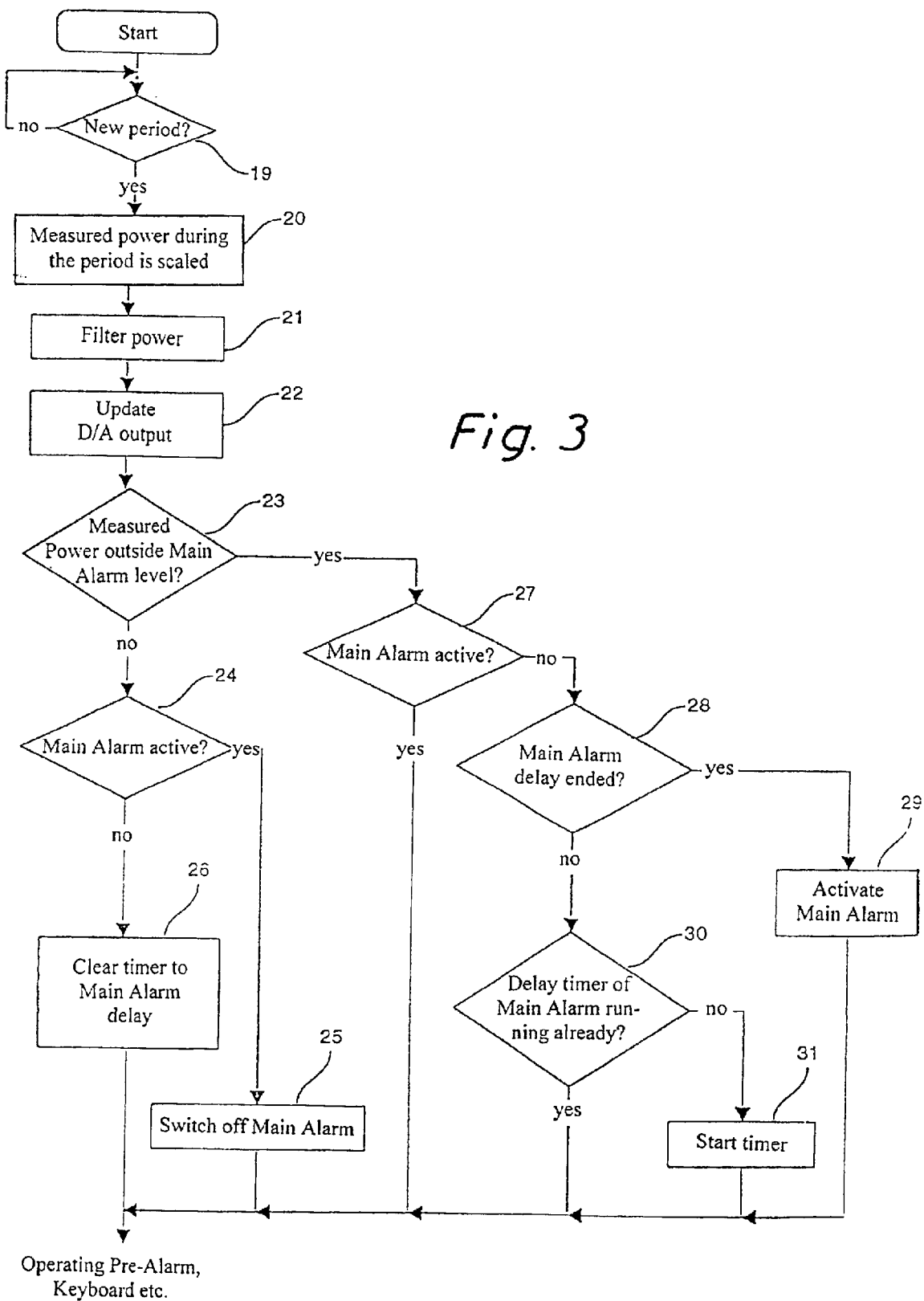

An embodiment of a load indicator according to the invention will now be described in more detail with reference to the accompanying drawings, in which FIG. 1 is a schematic block diagram of an embodiment of an inventive load indicator, FIG. 2 is a flow diagram of the presetting of alarm limits in an embodiment of a load indicator according to the invention, and FIGS. 3 and 4 are flow diagrams of the alarm function in an embodiment of a load indicator according to the invention.

In the block diagram shown in FIG. 1, a processor constitutes a central processing unit CPU in the load indicator. The central processing unit CPU has two inputs which are connected to an input stage II for current and to an input stage 1U for voltage respectively. Moreover the central processing unit CPU has an output for two relays L1 and L2 and an analog output, which via an isolating stage 1S is connected to a drive stage DS. Finally, the central processing unit CPU has bi-directional connections with, on the one hand, a memory unit ME and, on the other hand, a programming and presentation unit PP.

The load indicator has for its power supply also a mains supply circuit ND which has a motor voltage as supply voltage and separate voltage and earth connections for the drive step DS and the other units.

The input stage II for current is connected in a manner known per se to a current transformer which encloses one of the supply lines to the motor which the load indicator should monitor. Also the input stage 1U for voltage is connected in a manner known per se to the supply lines of the motor.

The programming and presentation unit PP comprises on the one hand a screen for character presentation and, on the other hand, a number of keys for inputting instructions to the central processing unit CPU. In particular one of these keys is a key T for starting an automatic setting of load limits or alarm levels, as will be described in more detail in the following.

The processor in the load indicator in FIG. 1 passes the process steps illustrated in FIG. 2 when said key for automatic setting of alarm levels is pressed, which should take place when the motor runs in normal operation.

In a first step 1, it is then detected whether alarm limits for overload or alarm limits for underload are to be set. If a maximum limit, i.e. a limit value of overload, is to be set, the current load is detected, and to this value there is added in a step 2 a deviation or margin value which is stored in the load indicator, e.g. in the memory unit ME, and represents the permissible maximum deviation above normal load, i.e. the load in normal operation, which does not require an alarm indication to be activated. The obtained sum, which thus is the maximum limit value, is in the next step 3 compared with the nominal power of the motor. If the maximum limit value is greater than 125% of the nominal power, the maximum limit value is set in a step 4 to equal 125% of the nominal power while otherwise the obtained sum is used as the maximum limit value.

The value of the current load, the deviation value and the nominal power are suitably calculated in percent of the latter.

Subsequently, a pre-alarm level is set in essentially the same fashion as the main alarm level. Thus, the current load is detected, and to this value there is added in a step 5 a margin value which is stored in the load indicator and represents the deviation corresponding to a pre-alarm level above normal load before activation of a pre-alarm indication. The obtained sum, which thus is the pre-alarm limit value, is compared in a next step 6 with the nominal power. If the pre-alarm limit value is greater than 125% of the nominal power, the pre-alarm limit value is set in a step 7 to equal 125% of the nominal power while otherwise the obtained sum is used as the pre-alarm limit value.

If the central processing unit CPU in the first step 1 detects that an alarm limit for underload is to be set, the current load is compared with the permissible maximum deviation in a step 8. If the current load is smaller than the permissible maximum deviation, the main limit value of underload is set to equal zero in a step 9 while otherwise the obtained difference value is introduced as a main alarm limit value in a step 10.

In the following, a pre-alarm value of underload is set in the same manner as the main alarm value of underload. Thus, the current load is compared with the deviation in the pre-alarm limit in a step 11. If the current load is smaller than the pre-alarm limit deviation, the pre-alarm limit value of underload is set to equal zero in a step 12 while otherwise the obtained difference value between the current load and the pre-alarm limit deviation is introduced as a pre-alarm limit value in a step 13.

In an alternative embodiment, alarm limits can be set for maximum load as well as minimum load, for instance, by the loops in FIG. 2 for maximum load and minimum load, respectively, being passed consecutively and not being mutually excluding.

It is also obvious that all values can be calculated in percent of the nominal power, as is the case in FIG. 2, but they can also be calculated in other ways. Thus, the deviation values can be calculated in percent of the current load or on some other relative scale. It is also possible to use values expressed on some actual scale, which may concern, for instance, power, torque or current.

The mode of operation of the above-described load indicator, after the setting of alarm limits in the manner that has also been described above, will now be described with reference to FIGS. 3 and 4. For the sake of simplicity, only the main alarm function will be described since the pre-alarm function is essentially analogous thereto.

The central processing unit CPU calculates a value of the current load for each period of the alternating current that is supplied to the alternating current motor monitored by the load indicator. This is illustrated in the flow diagram in FIG. 4, according to which the motor current and the motor voltage are sampled alternatingly, for instance 32 times during an alternating current period, and the sampled values are used to prepare a corresponding number of partial power values, which when summed up yield a value of the power supplied during a period of the alternating current. A timer 14 generates the sampling frequency, e.g. 1600 Hz, and an analog to digital converter 15 generates a digital sample value, which alternatingly represents a current value and a voltage value. In a step 16, it is thus decided if the central processing unit CPU in a step 17 should use the sample value as a voltage value, or in a step 18 use it as a current value. In step 18, the power supplied during the period is calculated by summing up the products, associated with the period, of voltage sample values and associated current sample values, each of the latter being taken as the average value of current sample values immediately before and after the respective voltage sample values.

In steps 17 and 18, the current sample values and the voltage sample values are added in a longer time interval than a period of the alternating current for the central processing unit CPU, with a suitable scaling of the cumulative values, to be able to present the current motor current and the current motor voltage on the display of the programming and presentation unit PP.

As shown in FIG. 3, the power cumulative value produced for each period is used to determine whether a preset alarm limit has been exceeded or not.

In a step 19, it is thus decided whether a new period has started. If this is the case, the power cumulative value is scaled for the preceding period in a suitable fashion in a step 20, and the power cumulative value in step 18 is cleared. In a subsequent step 21, a digital filtration occurs, i.e. a certain equalising of consecutive power cumulative values, and in a step 22 an update of the analog output signal occurs on the output of the drive stage DS.

In a next step 23, the measured power cumulative value is compared with the preset limit value for activating the main alarm of the load indicator.

If the measured power cumulative value is not outside the main alarm limit, it is checked in a step 24 whether the main alarm is activated. If this is the case, the main alarm is switched off in a step 25 whereas, if the main alarm is not activated, a timer 26 determining the main alarm delay is cleared. The central processing unit CPU is thus arranged to release a main alarm only when the measured power for a predetermined period of time has been outside the main alarm limit, i.e. after a predetermined time delay.

If the measured power cumulative value, however, is outside the main alarm limit, it is checked in a step 27 whether the main alarm is activated. If this is the case, the operation cycle is terminated for the present period while otherwise a check is made in a step 28 whether the delay time of the main alarm has expired. If this is the case, the main alarm is activated in a step 29 while in the opposite case a check is made in a step 30 whether the delay time has begun to run. If the delay time has begun to run, the operation cycle is terminated for the present period. In the opposite case, a timer is started in a step 31 for determination of the end of the delay time.

The above-described operation cycle is passed by the central processing unit CPU once for each period of alternating current to the motor. In between the central processing unit CPU processes similar operation cycles for one or more pre-alarms or for another main alarm which may concern underload, if the above-described main alarm is assumed to concern overload. In addition, the central processing unit CPU processes further operation cycles for other routines, such as key processing.

When activating a pre-alarm, for instance the output to the relay L1 can be activated, thereby obtaining a visual indication of this condition. Correspondingly, the relay L2 can be activated when a main alarm is released, whereby another visual indication can be obtained or the motor is switched off.

A person skilled in the art realises that several modifications of the above-described embodiment of a load indicator are feasible within the scope of the invention as defined by the appended claims. For example, the central processing unit CPU may comprise possibilities of afterwards manually setting alarm limits which differ from the alarm limits which are quickly settable by applying the inventive technique using deviation values. It is further obvious that the invention can be accomplished with different amounts of software and hardware, i.e. several of the means included may consist completely of software, partly of software and partly of hardware, or completely of hardware.

What is claimed is:

1. A load indicator for an electric motor, comprising a first means (II, IU, CPU) for repeated determination of the motor load, a second means (CPU) for comparing the current motor load, as determined by the first means, with a preset load limit, a third means (CPU, PP) for indicating that the current motor load exceeds the load limit, and a means (T, CPU) for initiating a presetting of the load limit as the current motor load changed by a predetermined deviation value stored in the load indicator, said initiating means being adapted to be manually actuated as the motor runs in normal operation.

2. A load indicator as claimed in claim 1, wherein the deviation value is stored as a percentage which, multiplied by the nominal power of the motor, yields the actual deviation value.

3. A load indicator as claimed in claim 1, wherein the deviation value is stored as a percentage which, multiplied by the current load, yields the actual deviation value.

4. A load indicator as claimed in claim 1, wherein deviation value is stored as a fixed value.

5. A load indicator as claimed in claim 1, wherein the initiating means (T, CPU) is adapted to preset two deviation values which represent deviations in the same direction of either underload or overload with respect to the motor load in normal operation.

6. A load indicator as claimed in claim 5, further comprising a means (1) for determining the direction of deviation.

7. A load indicator as claimed in claim 1, wherein the initiating means (T, CPU) is adapted to preset two deviation values which represent deviations in opposite directions of underload and overload, respectively, with respect to the motor load in normal operation.

8. A load indicator as claimed in claim 1, wherein the initiating means (T, CPU) is adapted to preset four deviation values, of which two represent different deviations in a first direction from the motor load in normal operation and two represent different deviations in a second direction, opposite to the first direction, from the motor load in normal operation, said first and second directions being either an underload or overload direction, respectively with respect to the motor load in normal operation.

9. A load indicator as claimed in claim 1, wherein the first means (II, IU, CPU) is adapted to determine the current motor load as the supplied power reduced by a value that represents the lost power of the motor.

10. A load indicator as claimed in claim 1, wherein the first means (II, IU, CPU) is adapted to determine the current motor load as the supplied power.

11. A load indicator as claimed in claim 1, wherein said initiating means includes a key arranged to start the presetting of the load limit when pressed.

* * * * *